United States Patent
Sue et al.

(10) Patent No.: US 11,747,724 B2
(45) Date of Patent: Sep. 5, 2023

(54) ORGANICALLY MODIFIED METAL OXIDE NANOPARTICLES, ORGANICALLY MODIFIED METAL OXIDE NANOPARTICLES-CONTAINING SOLUTION, ORGANICALLY MODIFIED METAL OXIDE NANOPARTICLES-CONTAINING RESIST COMPOSITION, AND RESIST PATTERN FORMING METHOD

(71) Applicant: NATIONAL INSTITUTE OF ADVANCED INDUSTRIAL SCIENCE AND TECHNOLOGY, Tokyo (JP)

(72) Inventors: Kiwamu Sue, Tsukuba (JP); Sho Kataoka, Tsukuba (JP); Yusuke Yoshigoe, Tsukuba (JP); Takatoshi Inari, Kawasaki (JP); Masatoshi Arai, Kawasaki (JP); Takaya Maehashi, Kawasaki (JP); Yoshitaka Komuro, Kawasaki (JP); Daisuke Kawana, Kawasaki (JP)

(73) Assignees: TOKYO OHKA KOGYO CO., LTD., Kawasaki (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 205 days.

(21) Appl. No.: 17/131,094

(22) Filed: Dec. 22, 2020

(65) Prior Publication Data
US 2021/0191261 A1    Jun. 24, 2021

(30) Foreign Application Priority Data

Dec. 24, 2019  (JP) .................................. 2019-233068
Dec. 15, 2020  (JP) .................................. 2020-207558

(51) Int. Cl.
*G03F 7/004*    (2006.01)
*C07F 7/00*     (2006.01)

(52) U.S. Cl.
CPC ............ *G03F 7/0042* (2013.01); *C07F 7/003* (2013.01)

(58) Field of Classification Search
CPC ....................................................... C07F 7/003
See application file for complete search history.

(56) References Cited

U.S. PATENT DOCUMENTS

2008/0242745 A1* 10/2008 Morimura .............. C01G 25/02
                                                                516/90
2021/0149299 A1*  5/2021 Sue ........................ G03F 7/0042

FOREIGN PATENT DOCUMENTS

| JP | 2001-072716 A | | 3/2001 | |
|---|---|---|---|---|
| JP | 2008044835 A | * | 2/2008 | ............ B82Y 30/00 |
| JP | 2012-185484 A | | 9/2012 | |
| JP | 2013216858 A | * | 10/2013 | ............ B32B 9/00 |
| JP | 2015-108781 A | | 6/2015 | |
| JP | 2015-157807 A | | 9/2015 | |
| JP | 2017-173537 A | | 9/2017 | |
| WO | WO-2013085062 A1 | * | 6/2013 | ............ B32B 9/00 |
| WO | WO-2017163610 A1 | * | 9/2017 | ............ B82Y 30/00 |
| WO | WO-2020004172 A1 | * | 1/2020 | ............ C07F 7/00 |
| WO | WO-2021131299 A1 | * | 7/2021 | |

OTHER PUBLICATIONS

Machine translation of JP 2013-216858 (no date).*
Machine translation of WO 2013/085062 (no date).*
MachineTranslation WO 2017/163610 (no date).*

* cited by examiner

*Primary Examiner* — Amanda C. Walke
(74) *Attorney, Agent, or Firm* — KNOBBE, MARTENS, OLSON & BEAR LLP

(57) ABSTRACT

Organically modified metal oxide nanoparticles containing two or more cores including a plurality of metal atoms and a plurality of oxygen atoms covalently bonded to the plurality of metal atoms; a first modifying group that is a ligand coordinated to each of the cores and selected from the group consisting of a carboxylic acid carboxylate, a sulfonic acid sulfonate, and a phosphonic acid phosphonate; and a second modifying group that is coordinated to each of the cores and is a ligand having a structure different from that of the first modifying group and/or an inorganic anion, in which organically modified metal oxide nanoparticles have a structure in which the cores are crosslinked through a coordinate bond by at least the first modifying group.

8 Claims, No Drawings

ORGANICALLY MODIFIED METAL OXIDE NANOPARTICLES, ORGANICALLY MODIFIED METAL OXIDE NANOPARTICLES-CONTAINING SOLUTION, ORGANICALLY MODIFIED METAL OXIDE NANOPARTICLES-CONTAINING RESIST COMPOSITION, AND RESIST PATTERN FORMING METHOD

BACKGROUND OF THE INVENTION

Field of the Invention

The present invention relates to an organically modified metal oxide nanoparticles that can be used as a photoresist material used in a semiconductor manufacturing process or the like, an organically modified metal oxide nanoparticles-containing solution, an organically modified metal oxide nanoparticles-containing resist composition, and a resist pattern forming method.

Priority is claimed on Japanese Patent Application No. 2019-233068, filed Dec. 24, 2019, and Japanese Patent Application No. 2020-207558, filed Dec. 15, 2020, the content of which is incorporated herein by reference.

Description of Related Art

In recent years, semiconductor circuit patterns have become thinner, accelerating the research and development of lithography using extreme ultraviolet light (EUV light). With the thinning of the pattern, the resist film used for pattern formation has become thinner. Therefore, a resist material having resistance to etching is required. As a candidate, composite materials of inorganic substances such as metal oxides and organic substances are being studied.

For example, methods using nanoparticles of oxides of metal such as zirconium or hafnium organically modified with an unsaturated carboxylic acid such as methacrylic acid as a negative resist material have been proposed (Japanese Unexamined Patent Application First Publication No. 2017-173537 and Japanese Unexamined Patent Application First Publication No. 2015-157807). Since the metal oxide nanoparticles have a metal oxide in the core, the resist materials containing the metal oxide nanoparticles have higher resistance to etching as compared with resist materials of organic substances.

Furthermore, due to the high symmetry of the structure of the metal oxide nanoparticles, the metal oxide nanoparticles are unlikely to remain as insoluble matter on the wafer when the resist material containing the metal oxide nanoparticles is developed.

Further, methods using a complex (mononuclear complex or salt) of metal such as zirconium or hafnium and an organic substance represented by a carboxylic acid such as methacrylic acid as a resist material have also been proposed (Japanese Unexamined Patent Application First Publication No. 2015-108781, Japanese Unexamined Patent Application First Publication No. 2012-185484, and Japanese Unexamined Patent Application First Publication No. 2001-72716). Since the size of the complex itself is small, the resist material is suitable for thinning as compared with resist materials containing a nanoparticle core. However, the resist material has a higher percentage of organic substances in the formed film than a resist material having nanoparticles as a core, and therefore has low resistance during etching. Furthermore, due to the low symmetry of the structure of the complex, the complex is likely to remain as an insoluble matter on the wafer when the resist material containing the complex is developed.

SUMMARY OF THE INVENTION

In view of the above, the synthesis of organically modified metal oxide nanoparticles with the core diameter controlled to be as small as possible is important for the development of resist materials to form fine patterns. However, regarding the reaction mechanism of the resist material during EUV exposure, although it is known that decarboxylation proceeds when an unsaturated carboxylic acid is used, the detailed mechanism and important factors in the exposure operation to determine resolution and sensitivity have not always been clarified, and it is required to establish a method for controlling resolution and sensitivity using a resist material.

The adjustment of sensitivity and resolution is often performed by optimizing the solvent and additives of the resist solution and developer. However, if the sensitivity and resolution of the resist material can be adjusted by controlling the structure of the organically modified metal oxide nanoparticles themselves, more specifically, by modifying with a plurality of modifying groups having different structures and controlling the composition in addition to the elements and structures constituting the core metal oxide, it becomes possible to examine a more diversified method for adjusting the resist material.

The present invention has been made in view of such circumstances, and an object thereof is to provide organically modified metal oxide nanoparticles that can be produced by a simple method and can increase the resolution and sensitivity of a resist material, an organically modified metal oxide nanoparticles-containing solution, an organically modified metal oxide nanoparticles-containing resist composition, and a resist pattern forming method.

Organically modified metal oxide nanoparticles of the first aspect of the present invention contain: two or more cores including a plurality of metal atoms and a plurality of oxygen atoms covalently bonded to the plurality of metal atoms; a first modifying group (A1) that is a ligand coordinated to each of the cores and selected from the group consisting of a carboxylic acid carboxylate, a sulfonic acid sulfonate, and a phosphonic acid phosphonate; and a second modifying group (A2) that is coordinated to each of the cores and is at least one member selected from the group consisting of a ligand having a structure different from that of the first modifying group and an inorganic anion, the organically modified metal oxide nanoparticles having a structure in which the cores are crosslinked through a coordinate bond by at least the first modifying group (A1).

An organically modified metal oxide nanoparticles-containing solution of the second aspect of the present invention contains: the organically modified metal oxide nanoparticles of the above aspect; and a solvent.

An organically modified metal oxide nanoparticles-containing resist composition of the third aspect of the present invention contains: the organically modified metal oxide nanoparticles of the above aspect; and a solvent, and may further contain an additive. The number of metal atoms contained in one core of the organically modified metal oxide nanoparticles is preferably in the range of 2 to 12.

A resist pattern forming method of forth aspect of the present invention includes: a step of forming a resist film on a support using the organically modified metal oxide nanoparticles-containing resist composition of the above aspect;

a step of exposing the resist film; and a step of developing the resist film after exposure to form a resist pattern.

According to the present invention, it is possible to provide organically modified metal oxide nanoparticles, an organically modified metal oxide nanoparticles-containing solution, an organically modified metal oxide nanoparticles-containing resist composition applicable to a resist material that can be produced by a simple method and has high resolution and sensitivity. Further, according to the present invention, it is possible to provide a resist pattern forming method in which the mask can be thinned.

DETAILED DESCRIPTION OF THE INVENTION

When a resist material is irradiated with EUV light, the reactivity, that is, the sensitivity, of organically modified metal oxide nanoparticles constituted by a metal oxide and a ligand such as carboxylic acid contained in the resist material and the resolution of the formed resist pattern greatly vary depending on the constituent elements and structure of the nanoparticle core, and the type, constituent elements, size, and molecular weight of the ligand to be coordinated, such as carboxylic acids. In order to disperse the nanoparticle resist material well in the solvent during the resist solution preparation, a carboxylic acid or the like having a high affinity with the solvent, that is, a structure necessary for maintaining the affinity is required as the first ligand. On the other hand, in view of the fact that decarboxylation of carboxyl groups of carboxylic acids proceeds upon irradiation with EUV light after the film formation, it is better to make the distance between particles in the film after the film formation as small as possible in order to avoid the expansion of the distribution of the microstructure of the film due to particle agglomeration by irradiation with EUV light, that is, the reduction of the resolution, and therefore, in order to narrow the distance between particles, for example, a carboxylic acid having a structure different from that of the first ligand is required as the second ligand.

The present inventors have found that, by coordinating ligands having different structures to a core of a metal oxide, high sensitivity of a resist film to EUV light, in other words, low solubility in a developer of an EUV-irradiated portion after EUV light irradiation, appears while maintaining solubility in a resist solvent and a developer of the obtained organically modified metal oxide nanoparticles, while maintaining high resolution when a resist material containing the organically modified metal oxide nanoparticles is irradiated with EUV light.

(Organically Modified Metal Oxide Nanoparticles)

Organically modified metal oxide nanoparticles according to an embodiment of the present invention include two or more cores, a first modifying group (A1), and a second modifying group (A2). Each of the core has a plurality of metal atoms and a plurality of oxygen atoms covalently bonded to the plurality of metal atoms. The core contains metal oxides. Each of the cores may include, in addition to the metal oxide crystal, a cluster of a structure in which a plurality of metal atoms are covalently crosslinked through a plurality of oxygen atoms, and/or a structure in which the cluster is coordinated with a cluster of another core by an organic ligand. That is, the present embodiment, the "core" may contain a structure in which at least a part thereof is constituted by a cluster, and/or a structure having a bonded structure in which a plurality of cores at least partially including a cluster are coordinated by a plurality of organic ligands. Metal oxide crystals and metal oxide clusters are common in that they are bonded products of metal and oxygen, but metal oxide crystals differ in that individual particles themselves form a crystal structure in which the metal and oxygen are arranged regularly in a three-dimensional manner and have a fixed size (for example, 3 nm to 4 nm), while metal oxide clusters are molecules in which individual particles have a metal complex structure, and individual particles themselves do not have a crystal structure. The plurality of metal atoms may be constituted by the same kind or different kinds. The first modifying group (A1) is a ligand coordinated to the core. The first modifying group (A1) is selected from the group consisting of a carboxylic acid carboxylate, a sulfonic acid sulfonate, and a phosphonic acid phosphonate. Herein, the carboxylic acid carboxylate indicates a carboxylate, the sulfonic acid sulfonate indicates a sulfonate, and phosphonic acid phosphonate indicates a phosphonate. The second modifying group (A2) is coordinated to the core and is at least one member selected from the group consisting of a ligand having a structure different from that of the first modifying group (A1) and an inorganic anion. The organically modified metal oxide nanoparticles have a structure in which the cores are crosslinked through a coordinate bond by at least the first modifying group (A1). The "structure in which the cores are crosslinked through a coordinate bond by at least the first modifying group (A1)" means that one or both of a structure in which two of the cores are crosslinked through a coordinate bond by the first modifying group (A1) and a structure in which two of the cores are crosslinked through a coordinate bond by the first modifying group (A1) and the second modifying group (A2). The two of the cores may contain an uncrosslinked first modifying group (A1) and/or an uncrosslinked second modifying group (A2), provided that they contain the crosslinked structure described above.

The first modifying group (A1) may be a ligand derived from a compound selected from the group consisting of General Formula (a01), General Formula (a02), and General Formula (a03):

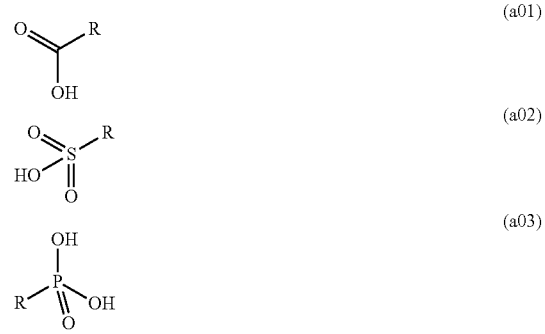

[In Formulae, each R is independently a group selected from an alkyl group having 1 to 18 carbon atoms, an alkoxyalkyl group having 1 to 18 carbon atoms, an alkenyl group having 1 to 18 carbon atoms, an alkenyloxyalkyl group having 1 to 18 carbon atoms, an alkynyl group having 1 to 18 carbon atoms, an alkynyloxyalkyl group having 1 to 18 carbon atoms, an aryl group having 1 to 18 carbon atoms, an aryloxyalkyl group having 1 to 18 carbon atoms, and a cyanoalkyl group having 1 to 18 carbon atoms, or a group in which one or two or more hydrogen atoms of any of the preceding groups are substituted with a substituent, provided that the substituent contains no carboxy group, no carboxylate group, no sulfo group, no sulfonate group, no phosphate group and no phosphonate group.]

The alkyl group, the alkenyl group and the alkynyl group of the alkyl group having 1 to 18 carbon atoms, the alkoxyalkyl group having 1 to 18 carbon atoms, the alkenyl group having 1 to 18 carbon atoms, the alkenyloxyalkyl group having 1 to 18 carbon atoms, the alkynyl group having 1 to 18 carbon atoms, the alkynyloxyalkyl group having 1 to 18 carbon atoms, the aryloxyalkyl group having 1 to 18 carbon atoms, and the cyanoalkyl group having 1 to 18 carbon atoms as R may be linear, be branched or include a cyclic structure, but be preferably linear or branched. In case where the alkyl group having 1 to 18 carbon atoms is linear, the alkyl group may preferably have 1 to 15 carbon atoms, more preferably 1 to 10 carbon atoms, further more preferably 1 to 6 carbon atoms, and particularly preferably 1 to 3 carbon atoms. In case where the alkyl group having 1 to 18 carbon atoms is branched or cyclic, the alkyl group may preferably have 3 to 15 carbon atoms, more preferably 3 to 10 carbon atoms, further more preferably 3 to 6 carbon atoms, and particularly preferably 3 to 5 carbon atoms. The alkoxyalkyl group having 1 to 18 carbon atoms may preferably have 3 to 18 carbon atoms, more preferably 3 to 12 carbon atoms, further more preferably 3 to 10 carbon atoms, and particularly preferably 3 to 6 carbon atoms. The alkenyl group having 1 to 18 carbon atoms may preferably have 2 to 15 carbon atoms, more preferably 2 to 10 carbon atoms, further more preferably 2 to 6 carbon atoms, and particularly preferably 2 to 4 carbon atoms. The alkenyloxyalkyl group having 1 to 18 carbon atoms may preferably have 3 to 15 carbon atoms, more preferably 3 to 10 carbon atoms, further more preferably 3 to 6 carbon atoms, and particularly preferably 3 to 5 carbon atoms. The alkynyl group having 1 to 18 carbon atoms may preferably have 2 to 15 carbon atoms, more preferably 2 to 10 carbon atoms, further more preferably 2 to 6 carbon atoms, and particularly preferably 2 to 4 carbon atoms. The alkynyloxyalkyl group having 1 to 18 carbon atoms may preferably have 3 to 15 carbon atoms, more preferably 3 to 10 carbon atoms, further more preferably 3 to 6 carbon atoms, and particularly preferably 3 to 5 carbon atoms. The aryl group having 1 to 18 carbon atoms may preferably have 6 to 15 carbon atoms, more preferably 6 to 12 carbon atoms, further more preferably 6 to 10 carbon atoms, and particularly preferably 6 to 8 carbon atoms. The aryloxyalkyl group having 1 to 18 carbon atoms may preferably have 6 to 15 carbon atoms, more preferably 6 to 12 carbon atoms, further more preferably 6 to 10 carbon atoms, and particularly preferably 6 to 8 carbon atoms. The cyanoalkyl group having 1 to 18 carbon atoms may preferably have 1 to 15 carbon atoms, more preferably 1 to 10 carbon atoms, further more preferably 1 to 6 carbon atoms, and particularly preferably 1 to 4 carbon atoms. In the alkyl group having 1 to 18 carbon atoms, the alkoxyalkyl group having 1 to 18 carbon atoms, the alkenyl group having 1 to 18 carbon atoms, the alkenyloxyalkyl group having 1 to 18 carbon atoms, the alkynyl group having 1 to 18 carbon atoms, the alkynyloxyalkyl group having 1 to 18 carbon atoms, the aryl group having 1 to 18 carbon atoms, the aryloxyalkyl group having 1 to 18 carbon atoms, and the cyanoalkyl group having 1 to 18 carbon atoms, examples of the substituents that may substitute a hydrogen atom include, but not limited to, for example, an amino group, a hydroxy group, a cyano group, and a halogen atom (a fluorine atom, a chlorine atom, a bromine atom, iodine atom, and the like). The substituents contain no carboxy group, no carboxylate group, no sulfo group, no sulfonate group, no phosphate group and no phosphonate group.

When the compound represented by General Formula (a01) coordinate to the core, H is liberated from $-C(=O)OH$ in General Formula (a01) and $-C(=O)OH$ becomes $-C(=O)O^-$. Therefore, the first modifying group (A1) derived from the compound represented by General Formula (a01) can be represented by the formula "$R-C(=O)O^-$". When the compound represented by General Formula (a02) coordinate to the core, H is liberated from $-S(=O_2)OH$ in General Formula (a02) and $-S(=O_2)OH$ becomes $-S(=O_2)O^-$. Therefore, the first modifying group (A1) derived from the compound represented by General Formula (a02) can be represented by the formula "$R-S(=O_2)O^-$".

When the compound represented by General Formula (a03) coordinate to the core, H is liberated from $-P(=O)(OH)_2$ in General Formula (a03) and $-P(=O)(OH)_2$ becomes $-P(=O)(OH)O^-$ or $-P(=O)(O^-)_2$. Therefore, the first modifying group (A1) derived from the compound represented by General Formula (a03) can be represented by the formula "$P(=O)(OH)O^-$" or "$R-P(=O)(O^-)_2$".

The first modifying group (A1) is preferably a carboxylic acid carboxylate ligand, more preferably a ligand derived from a saturated carboxylic acid, and still more preferably a ligand derived from a propionic acid or methacrylic acid. The first modifying group (A1) may be one kind or two or more kinds.

When the first modifying group (A1) is a carboxylic acid carboxylate ligand, the second modifying group (A2) is preferably a ligand selected from a carboxylic acid carboxylate having a structure different from that of the first modifying group (A1), a sulfonic acid sulfonate, a phosphonic acid phosphonate, a hydroxy group-containing ligand, a thiol group-containing ligand, an amino group-containing ligand, a nitrate ligand (nitrate ion), and a hydroxide ion, more preferably a ligand selected from a carboxylic acid carboxylate having a structure different from that of the first modifying group (A1) and a sulfonic acid sulfonate, and particularly preferably a carboxylic acid carboxylate having a structure different from that of the first modifying group (A1). The second modifying group (A2) may be one kind or two or more kinds. When the second modifying group (A2) is two or more kinds, the second modifying group (A2) preferably includes at least one selected from the group consisting of a hydroxide ion and a hydroxy group, and at least one selected from the group consisting of a carboxylic acid carboxylate having a structure different from that of the first modifying group (A1), a sulfonic acid sulfonate, a phosphonic acid phosphonate, and more preferably a carboxylic acid carboxylate having a structure different from that of the first modifying group (A1) and a hydroxide ion.

Examples of the carboxylic acid carboxylate ligand include ligands derived from acetic acid, propionic acid, butyric acid, isobutyric acid, methacrylic acid, valeric acid, and caproic acid.

Examples of the sulfonic acid sulfonate ligand include ligands derived from methyl sulfonic acid, trifluoromethane sulfonic acid, p-toluene sulfonic acid, and the like.

Examples of the phosphonic acid phosphonate ligand include ligands derived from methylphosphonic acid, and phenylphosphonic acid.

Examples of the thiol group-containing ligand include ligands derived from butylthiol, benzothiol, trifluoromethylbenzothiol, and the like.

Examples of the amino group-containing ligand include ligands derived from hexylamine and aniline.

When the second modifying group (A2) is a ligand having a structure different from that of the first modifying group (A1), the ligand may be selected from the group consisting of a carboxylic acid carboxylate, a sulfonic acid sulfonate, and a phosphonic acid phosphonate, and the ligands listed as the first modifying group (A1) may be applied.

When the second modifying group (A2) is an inorganic anion, examples of the inorganic anion include a nitrate ligand (nitrate ion) and a hydroxide ion.

When the second modifying group (A2) is a ligand having a structure different from that of the first modifying group (A1) and an inorganic anion, examples thereof include an acetic acid carboxylate ligand and a hydroxide ion.

Specifically, the organically modified metal oxide nanoparticle of the present embodiment are preferably represented by Formula (m01):

in Formula (m01),

C01 is $M_6O_4(OH)_4[X_aY_b]$, where $0 \leq a \leq 10$ and $1 \leq b \leq 11$;
C02 is $M_6O_4(OH)_4[X_cY_d]$, where $0 \leq c \leq 10$ and $1 \leq d \leq 11$;
and L01 is $X_w$,
where $w = 24-(a+b+c+d)$, and $2 \leq w \leq 12$, provided that M is the metal atom, and including one or more which is a metal atom belonging to Group 4 elements, X is the first modifying group (A1), and Y is the second modifying group (A2).

In Formula (m01), the number of ligands of the first modifying groups (A1) of C01 and C02 located on both sides of L01 may be the same as (a=c) or different from (a≠c) each other. Further, the number of ligands of the second modifying groups (A2) of C01 and C02 may be the same as (b=d) or different from (b≠d) each other.

The number of ligands of the first modifying group (A1) that crosslinks C01 and C02 is preferably 2 or more and 8 or less ($2 \leq w \leq 8$), and more preferably 2 or more and 4 or less ($2 \leq w \leq 4$).

The metal atom belonging to Group 4 elements is preferably one or more selected from Zr, Hf, and Ti, and more preferably Zr.

The first modifying group (A1) represented by X is preferably a carboxylic acid carboxylate, more preferably a ligand derived from propionic acid or methacrylic acid, further more preferably a ligand derived from propionic acid.

Examples of the combinations of X and Y include, for example, the combination of a ligand derived from methacrylic acid as X and a ligand derived from propionic acid as Y, and the combination of a ligand derived from propionic acid as X and a ligand derived from methacrylic acid as Y. The combination of X and Y is preferably the combination of a ligand derived from propionic acid as X and a ligand derived from methacrylic acid as Y.

In Formula (m01), OH functions as the second modifying group (A2). That is, the organically modified metal oxide nanoparticle represented by Formula (m01) includes Y and OH as the second modifying group (A2).

Each of a and c is independently preferably 1 or more and 9 or less ($1 \leq a \leq 9$, $1 \leq c \leq 9$), more preferably 2 or more and 8 or less ($2 \leq a \leq 8$, $2 \leq c \leq 8$), further more preferably 3 or more and 7 or less ($3 \leq a \leq 7$, $3 \leq c \leq 7$). Each of b and d is independently preferably 2 or more and 10 or less ($2 \leq b \leq 10$, $2 \leq d \leq 10$), more preferably 2 or more and 8 or less ($2 \leq b \leq 8$, $2 \leq d \leq 8$), further more preferably 3 or more and 7 or less ($3 \leq b \leq 7$, $3 \leq d \leq 7$).

Specific examples of the organically modified metal oxide nanoparticles include, but not limited to, the organically modified metal oxide nanoparticle (m01-1) in which C01, C02 and L01 in Formula (m01) are respectively as follows:

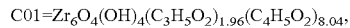

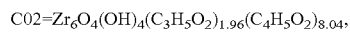

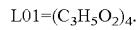

For the organically modified metal oxide nanoparticle (m01-1), in Formula (m01), M=Zr, $X=C_3H_5O_2$, $Y=C_4H_5O_2$, a=1.96, b=8.04, c=1.96, d=8.04, w=4.

(Organically Modified Metal Oxide Nanoparticles-Containing Solution)

An organically modified metal oxide nanoparticles-containing solution according to an embodiment of the present invention contains the organically modified metal oxide nanoparticle of the above embodiment and a solvent.

Examples of the solvent for the solution include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO). The solvent may be a mixed solvent containing an organic solvent as described above as a main component and a small amount of water.

Since the organically modified metal oxide nanoparticles are easily soluble in propylene glycol 1-monomethyl ether 2-acetate (PGMEA), which is one of the general-purpose resist solvents, PGMEA is preferably used as the solvent for the solution.

In addition to the particles (dimers) in which two structures of $M_6O_4(OH)_4$ are crosslinked through a coordinate bond of a ligand as represented by Formula (m01), a structure in which a monomer of $M_6O_4(OH)_4[X_aY_b]$ is not crosslinked, where $0 \leq a \leq 10$ and $1 \leq b \leq 11$, can also be adopted as the metal oxide cluster. In view of the particle size alone, it is likely that the monomer is superior in forming fine lines. However, in actual resist applications, sensitivity is extremely important. In general, when the dissolution rate of the EUV non-irradiated portion is too high, the insolubilization of the irradiated portion tends to be difficult. Smaller particles are superior not only in resolution but also in dissolution rate, but on the other hand, when the particles are too small, the dissolution rate is too high, so that the particles do not become poorly soluble and the sensitivity deteriorates even if the irradiation amount is increased. Therefore, it is important to control the dissolution rate appropriately, and the organically modified metal oxide nanoparticles are preferably a dimer or a mixture of a dimer and a monomer.

(Organically Modified Metal Oxide Nanoparticles-containing Resist Composition)

An organically modified metal oxide nanoparticles-containing resist composition according to an embodiment of the present invention contains the organically modified metal oxide nanoparticles of the above embodiment and a solvent.

Examples of the solvent for the resist composition include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO). The solvent may be a mixed solvent containing an organic solvent as described above as a main component and a small amount of water.

Since the organically modified metal oxide nanoparticles are easily soluble in propylene glycol 1-monomethyl ether 2-acetate (PGMEA), which is one of the general-purpose resist solvents, PGMEA is preferably used as the solvent for the resist composition.

The resist composition may contain additives. Examples of the additives include dispersants and stabilizers such as organic carboxylic acids and compounds selected from the group consisting of oxo acids of phosphorus and derivatives thereof, photoresponsive agents such as acid generators, crosslinking accelerators, surfactants, base components, and fluorine additive components. The organically modified metal oxide nanoparticles-containing resist composition may contain two or more of the above additives. Even when an additive is added to a solvent containing organically modified metal oxide nanoparticles, high resolution can be maintained upon irradiation with EUV light while maintaining the solubility of the organically modified metal oxide nanoparticles in the solvent, and high sensitivity of the resist film to the EUV light can be developed.

The acid generator is a substance that generates an acid by exposure due to the action of exposure light or the like. Such acid generators include various acid generators, including: an onium salt-based acid generator such as an iodonium salt and a sulfonium salt, and an oxime sulfonate acid generator; diazomethane acid generator such as bisalkyl or bisarylsulfonyldiazomethanes and poly(bissulfonyl)diazomethanes; nitrobenzyl sulfonate-based acid generators, iminosulfonate-based acid generators, and disulfonate-based acid generators.

The crosslinking accelerator is a compound that generates an acid or base by light or heat. By further containing the crosslinking accelerator, the resist pattern forming property and the etching selectivity can be improved. Examples of the crosslinking accelerator include onium salt compounds and N-sulfonyloxyimide compounds.

The surfactant is a component having an action to improve coating properties, striation, and the like. The surfactant used may be, for example, an ionic or nonionic fluorine-based surfactant and/or a silicon-based surfactant.

The base component is a compound that traps the acid generated by exposure (that is, controls the diffusion of the acid). Examples of the base component include a photodisintegrating base that is decomposed by exposure and loses acid diffusion controllability and a nitrogen-containing organic compound.

The fluorine additive component is a compound for imparting water-repellency to the resist film or improving lithographic characteristics. The component (F) used may be fluorine-containing polymer compounds disclosed in Japanese Unexamined Patent Application First Publication No. 2010-002870, Japanese Unexamined Patent Application First Publication No. 2010-032994, Japanese Unexamined Patent Application First Publication No. 2010-277043, Japanese Unexamined Patent Application First Publication No. 2011-13569, and Japanese Unexamined Patent Application First Publication No. 2011-128226.

A method for producing organically modified metal oxide nanoparticles according to an embodiment of the present invention includes a reaction step of reacting a metal oxyacetate and/or a metal alkoxide with an acid selected from the group consisting of a carboxylic acid, a sulfonic acid, and a phosphonic acid in a liquid. Examples of the liquid include water, methanol, ethanol, propanol, butanol, and acetone.

An example of a method for producing organically modified metal oxide nanoparticles using metal alkoxide will be described. A solution of a metal alkoxide is added to two kinds of carboxylic acids having different structures from each other, stirred as necessary, and the precipitate thus obtained is washed multiple times with an alcohol, collected by filtration and dried. In this way, the organically modified metal oxide nanoparticles of the present embodiment can be obtained by a simple method. Further, the metal alkoxide is preferably one or more of zirconium alkoxide, hafnium alkoxide, and titanium alkoxide, and more preferably zirconium alkoxide.

The organically modified metal oxide nanoparticles-containing resist composition according to an embodiment of the present invention can be prepared by filtering the organically modified metal oxide nanoparticles-containing solution with a membrane filter having a pore size of about 0.1 μm.

Further, the organically modified metal oxide nanoparticles-containing resist composition according to the embodiment of the present invention may be dissolved in a solvent component, and then impurities and the like may be removed by using a polyimide porous membrane, a polyamideimide porous membrane or the like. For example, the resist composition may be filtered using a filter made of a polyimide porous membrane, a filter made of a polyamideimide porous membrane, a filter made of a polyimide porous membrane and a polyamideimide porous membrane, or the like. Examples of the polyimide porous membrane and the polyamideimide porous membrane include those disclosed in Japanese Unexamined Patent Application First Publication No. 2016-155121.

A pattern forming method according to an embodiment of the present invention includes a film forming step, an exposure step, and a resist pattern forming step. In the film forming step, a resist film is formed on a support using the organically modified metal oxide nanoparticles-containing solution of the present embodiment or the organically modified metal oxide nanoparticles-containing resist composition of the present embodiment. For example, the solution or the resist composition is applied onto the layer to be etched and dried to obtain a resist film. The type of the layer to be etched is not particularly limited. The layer to be etched is not particularly limited, and conventionally known layers can be used, and examples thereof include a substrate for electronic components and a layer on which a predetermined wiring pattern is formed. More specific examples thereof include a silicon wafer, a metal substrate such as copper, chromium, iron, or aluminum, and a glass substrate.

Further, the support may be one in which an inorganic and/or organic film is provided on the substrate as described above. Examples of the inorganic film include an inorganic antireflection film (inorganic BARC). Examples of the organic film include an organic antireflection film (organic BARC) and an organic film such as a lower organic film in the multilayer resist method.

In the exposure step, the resist film is exposed. For example, the resist film is irradiated with EUV light in a predetermined pattern. In the developing step, the resist film after exposure is developed to form a resist pattern. For example, the resist film is immersed in a developer such as butyl acetate, and the portion not irradiated with EUV light is dissolved in the developer and removed to form an etching opening. By using the organically modified metal oxide nanoparticles-containing solution of the present embodiment or the organically modified metal oxide nanoparticles-containing resist composition of the present embodiment, the line width of the etching mask can be reduced to, for example, 20 nm or less. Therefore, the mask can be thinned, and the layer to be etched can be finely etched.

In the resist pattern forming step, the resist film exposed in the exposure step is developed to form a resist pattern. Examples of the developer used for this development include an alkaline aqueous solution and a developer containing an organic solvent.

Examples of the alkaline aqueous solution include an alkaline aqueous solution in which at least one alkaline compound such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide (TMAH), pyrrole, piperidine, choline, and 1,8-diazabicyclo-[5.4.0]-7-undecene, 1,5-diazabicyclo-[4.3.0]-5-nonene is dissolved.

Examples of the organic solvent in the developer containing an organic solvent include the same organic solvents exemplified for the solvent. Among these, preferred is an alcohol-based solvent, an amide-based solvent, an ester-based solvent, an ether-based solvent, a ketone-based solvent, a hydrocarbon-based solvent, or a combination thereof, and particularly preferred is butyl acetate.

These developers may be used alone or in combination of two or more kinds. After development, it is common to wash with water and then dry.

EXAMPLES

Hereinafter, Examples of the present invention will be described. The present invention is not limited to the following Examples.

Example 1

To a container, were added 2.47 mL of propionic acid and 2.78 mL of methacrylic acid and the mixture was mixed until homogeneous. Thereto, was slowly added 4.5 mL of 80 wt % zirconium butoxide 1-butanol solution. After capping, stirring was continued at room temperature until a precipitate formed (1 to 20 days). The resulting precipitate was washed five times with a minimum amount of n-butanol (3 mL) and vacuum-dried. This was pulverized to obtain a white solid. From the result of analyzing this white powder by NMR (apparatus name "AVANCE III 400", manufactured by Bruker), it was confirmed that the ratio of amount of substance (so-called molar ratio) of the ligands contained in the powder was propionic acid: methacrylic acid=33:67=3.96:8.04. From the analysis result of TG-TDA (apparatus name "STA-7200", manufactured by HITACHI), the weight loss rate was found to be 54.3%. Furthermore, as a result of IR analysis of (apparatus name "NICOLET 6700", manufactured by Thermo Scientific Co., Ltd.) of the white powder, an absorption peak derived from carboxy group ($1550 \text{ cm}^{-1}$ and $1420 \text{ cm}^{-1}$) was confirmed.

In 5.0 g of PGMEA, 0.15 g of the white powder was dissolved. The undissolved white powder was removed using centrifugation and a filter with a pore size of 0.2 μm. As a result of dynamic light scattering analysis (apparatus name "Zetasizer Nano S", manufactured by Malvern) of the solution after the removal, the volume-based average particle size of the white powder was found to be about 3 nm. The results suggested that the white powder thus obtained was organically modified metal oxide nanoparticles in which propionic acid and methacrylic acid is coordinated with respect to the core constituted by zirconium and oxygen.

Since the value of the particle size of about 3 nm obtained from the result of the dynamic light scattering analysis is the diameter of the dispersed particle containing the surrounding ligand, at least a part of the core was not a metal oxide crystal but a cluster in which zirconium atoms were crosslinked with oxygen atoms. From the result of single-crystal X-ray structure analysis (apparatus name, "XtaLAB P200", manufactured by RIGAKU), it was confirmed that the cluster had a structure in which two cores with a composition of $Zr_6O_4(OH)_4$ in which six zirconium atoms are covalently crosslinked with oxygen atoms are crosslinked through a coordinate bond of propionic acid. From the results of TG-TDA, the proportion of residue ($ZrO_2$) after analysis was found to be 45.7%. Based on the above results, it was confirmed that the white powder had a $ZrO_2$ equivalent content of 44.7%, and $[Zr_6O_4(OH)_4(C_4H_5O_2)_{8.04}(C_3H_5O_2)_{3.96}]_2$, Corresponding to Formula (m01), C01, C02 and L01 are as follow:

$$C01 = Zr_6O_4(OH)_4(C_3H_5O_2)_{1.96}(C_4H_5O_2)_{8.04},$$

$$C02 = Zr_6O_4(OH)_4(C_3H_5O_2)_{1.96}(C_4H_5O_2)_{8.04}, \text{ and}$$

$$L01 = (C_3H_5O_2)_4,$$

provided that M, X, Y, a, b, c, d, and w in Formula (m01) are M=Zr, X=$C_3H_5O_2$, Y=$C_4H_5O_2$, a=1.96, b=8.04, c=1.96, d=8.04, w=4.

Comparative Example 1

In a glovebox, 1.02 g of methacrylic acid was added to 1.40 g of 85% zirconium butoxide 1-butanol solution. Then, the mixture was stirred and allowed to stand for about 3 weeks to obtain transparent crystals. From the result of single-crystal X-ray structure analysis (apparatus name, "XtaLAB Synergy-S", manufactured by RIGAKU), it was confirmed that the cluster had one core with a composition of $Zr_6O_4(OH)_4$ in which six zirconium atoms were covalently crosslinked with oxygen atoms, and had a structure of $Zr_6O_4(OH)_4(C_4H_5O_2)_{12}$ in which twelve methacrylic acid molecules were crosslinked through a coordinate bond around the one core. The transparent crystals were collected by vacuum filtration, vacuum dried at room temperature for 1 day, and pulverized to obtain a white powder. As a result of elemental analysis of the white powder, the carbon content was found to be 36 wt %. As a result of thermogravimetric analysis of the white powder, the weight loss rate was found to be 57%.

In addition, as a result of IR analysis (apparatus name "NICOLET 6700", manufactured by Thermo Fisher Scientific Co., Ltd.) of the white powder, an absorption peak derived from carboxy group (1558 $cm^{-1}$) and an absorption peak of the stretching vibration band of C=C (1647 $cm^{-1}$) of methacrylic acid, and an absorption peak of the out-of-plane bending vibration of the vinyl group CH (827 $cm^{-1}$) were confirmed. Furthermore, as a result of matrix-assisted laser desorption/ionization time-of-flight mass spectrometry (MALDI-TOF/MS) (apparatus name "autoflex speed", manufactured by Bruker) of the white powder, a peak was found at m/z 1702 was present, which is equal to the molecular weight of zirconia hexamer coordinated with methacrylic acid. From the above, the white powder thus obtained was found to be $Zr_6O_4(OH)_4(C_4H_5O_2)_{12}$.

In 3.0 g of PGMEA, 0.09 g of the white powder was dissolved. The undissolved white powder was removed using centrifugation and a filter with a pore size of 0.45 μm. As a result of dynamic light scattering analysis of the solution after the removal, the volume-based average particle size of the white powder was found to be about 2 nm. The results suggested that the white powder thus obtained was organically modified metal oxide nanoparticles in which methacrylic acid is coordinated to a core constituted by zirconium and oxygen.

(Formation of Resist Pattern)

A resist pattern was formed using the PGMEA solution containing the organically modified metal oxide nanoparticle prepared in the above Example 1 as the resist composition of Example 1, and the PGMEA solution containing the organically modified metal oxide nanoparticle prepared in the above Comparative Example 1 as the resist composition of Comparative Example 1.

Each of resist compositions of Example 1 and Comparative Example 1 was dripped onto a silicon wafer and rotated at 1500 rpm for 60 seconds to form a film, and then heated at 80° C. for 60 seconds to obtain a resist film. After EUV exposure of the resist film at an irradiation amount of 0 to 25 mJ/$cm^2$ (apparatus name, "EUV Frame Exposure System EUVES-7000GC", manufactured by Litho Tech Japan Corporation), the resist film was immersed in butyl acetate for 30 seconds for development, and after drying, the film thickness was measured by a spectroscopic ellipsometer (apparatus name, "UVISEL" manufactured by HORIBA Jobin Yvon) to obtain sensitivity.

TABLE 1

| | Sensitivity (mJ/$cm^2$) |
|---|---|
| Example 1 | 13 |
| Comparative Example 1 | 25 |

As can be seen from the results in Table 1 above, it was confirmed that the resist composition of Example 1 was superior in sensitivity to Comparative Example 1.

INDUSTRIAL APPLICABILITY

The organically modified metal oxide nanoparticles-containing resist solution, the organically modified metal oxide nanoparticles-containing resist composition, and the pattern forming method of the present invention have excellent sensitivity, and therefore can be suitably used for the manufacture of semiconductor devices expected to be further refined in the future.

While preferred embodiments of the invention have been described and illustrated above, it should be understood that these are slope of the invention and are not to be considered as limiting. Additions, omissions, substitutions, and other modifications can be made without departing from the spirit or scope of the present invention. Accordingly, the invention is not to be considered as being limited by the therefore description, and is only limited by the scope of the appended claims.

What is claimed is:

1. Organically modified metal oxide nanoparticles comprising:
    two or more cores including a plurality of metal atoms and a plurality of oxygen atoms covalently bonded to the plurality of metal atoms;
    a first modifying group (A1) that is a ligand coordinated to each of the cores and selected from the group consisting of a carboxylic acid carboxylate, a sulfonic acid sulfonate, and a phosphonic acid phosphonate; and
    a second modifying group (A2) that is coordinated to each of the cores and is at least one selected from the group consisting of a ligand having a structure different from that of the first modifying group (A1) and an inorganic anion,
wherein the organically modified metal oxide nanoparticle has a structure in which the cores are crosslinked through a coordinate bond by at least the first modifying group (A1), and
    wherein the organically modified metal oxide nanoparticle is represented by Formula (m01):

wherein C01 is $M_6O_4(OH)_4[X_aY_b]$, where $0 \leq a \leq 10$ and $1 \leq b \leq 11$; C02 is $M_6O_4(OH)_4[X_cY_d]$, where $0 \leq c \leq 10$ and $1 \leq d \leq 11$; and L01 is Xw, where w=24−(a+b+c+d) and $2 \leq w \leq 12$,
    provided that M is the metal atom, which is a metal atom belonging to Group 4 elements, X is the first modifying group (A1), and Y is the second modifying group (A2).

2. The organically modified metal oxide nanoparticles according to claim 1, wherein the first modifying group (A1) is a ligand derived from a compound selected from the group consisting of General Formula (a01), General Formula (a02), and General Formula (a03):

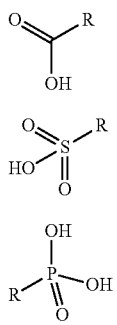

wherein, in General Formula (a01), General Formula (a02), and General Formula (a03), each R is independently a group selected from the group consisting of an alkyl group having 1 to 18 carbon atoms, an alkoxyalkyl group having 1 to 18 carbon atoms, an alkenyl group having 1 to 18 carbon atoms, an alkenyloxyalkyl group having 1 to 18 carbon atoms, an alkynyl group having 1 to 18 carbon atoms, an alkynyloxy alkyl group having 1 to 18 carbon atoms, an aryl group having 1 to 18 carbon atoms, an aryloxyalkyl group having 1 to 18 carbon atoms, and a cyanoalkyl group having 1 to 18 carbon atoms, or a group in which one or two or more hydrogen atoms of any of the preceding groups are substituted with a substituent, provided that the substituent contains no carboxy group, no carboxylate group, no sulfo group, no sulfonate group, no phosphate group and no phosphonate group.

3. The organically modified metal oxide nanoparticles according to claim 1, wherein the first modifying group (A1) is a carboxylic acid carboxylate ligand.

4. The organically modified metal oxide nanoparticles according to claim 1, wherein the first modifying group (A1) is a carboxylic acid carboxylate ligand; and the second modifying group (A2) is selected from the group consisting of a carboxylic acid carboxylate having a different structure from that of the first modifying group (A1), a sulfonic acid sulfonate having a different structure from that of the first modifying group (A1), a phosphonic acid phosphonate having a different structure from that of the first modifying group (A1), a hydroxy group-containing ligand, a thiol group-containing ligand, an amino group-containing ligand, nitrate ligand, and a hydroxide ion.

5. The organically modified metal oxide nanoparticle according to claim 1,
wherein the metal atom is Zr.

6. An organically modified metal oxide nanoparticles-containing solution, comprising:
the organically modified metal oxide nanoparticles according to claim 1; and
a solvent.

7. An organically modified metal oxide nanoparticles-containing resist composition, comprising:
the organically modified metal oxide nanoparticles according to claim 1; and
a solvent.

8. A resist pattern forming method, comprising:
forming a resist film on a support using the organically modified metal oxide nanoparticles-containing resist composition according to claim 7;
exposing the resist film; and
developing the resist film after exposure to form a resist pattern.

* * * * *